United States Patent
Miller et al.

(10) Patent No.: US 11,645,134 B2
(45) Date of Patent: May 9, 2023

(54) APPARATUSES AND METHODS FOR FUSE ERROR DETECTION

(71) Applicant: Micron Technology, Inc., Boise, ID (US)

(72) Inventors: Daniel S. Miller, Boise, ID (US); Kevin G. Werhane, Kuna, ID (US); Yoshinori Fujiwara, Boise, ID (US); Christopher G. Wieduwilt, Boise, ID (US); Jason M. Johnson, Nampa, ID (US); Minoru Someya, Chofu (JP)

(73) Assignee: Micron Technology, Inc., Boise, ID (US)

( * ) Notice: Subject to any disclaimer, the term of this patent is extended or adjusted under 35 U.S.C. 154(b) by 667 days.

(21) Appl. No.: 16/545,721

(22) Filed: Aug. 20, 2019

(65) Prior Publication Data

US 2021/0055981 A1    Feb. 25, 2021

(51) Int. Cl.
*G06F 11/00* (2006.01)
*G06F 11/07* (2006.01)
*G11C 17/16* (2006.01)
*H03K 19/21* (2006.01)

(52) U.S. Cl.
CPC ...... *G06F 11/0751* (2013.01); *G06F 11/0727* (2013.01); *G11C 17/16* (2013.01); *H03K 19/21* (2013.01)

(58) Field of Classification Search
None
See application file for complete search history.

(56) References Cited

U.S. PATENT DOCUMENTS

| | | | |
|---|---|---|---|
| 6,788,091 B1 * | 9/2004 | Weber | G01R 31/2856 324/759.02 |
| 2011/0035623 A1 * | 2/2011 | Gaskins | G06F 11/2236 712/42 |
| 2017/0184662 A1 * | 6/2017 | Varadarajan | G11C 29/44 |
| 2020/0321071 A1 * | 10/2020 | Varadarajan | G11C 17/16 |

OTHER PUBLICATIONS

Google Scholar/Patents—text refined (Year: 2022).*
Google Scholar/Patents search—text refined (Year: 2022).*

* cited by examiner

*Primary Examiner* — Christopher S McCarthy
(74) *Attorney, Agent, or Firm* — Dorsey & Whitney LLP

(57) ABSTRACT

An example fuse error detection circuit configured to receive a first data set from a fuse array during a first fuse data broadcast and to encode the first data set to provide first signature data. The fuse error detection circuit is further configured to receive a second data set from the fuse array during a second fuse data broadcast and to encode the second data set to provide second signature data. The fuse error detection circuit is further configured to compare the first signature data and the second signature data and to provide a match indication having a value based on the comparison between the first signature data and the second signature data.

21 Claims, 7 Drawing Sheets

APPARATUSES AND METHODS FOR FUSE ERROR DETECTION

BACKGROUND

High data reliability, high speed of memory access, low power, and reduced chip size are features that are demanded from semiconductor memory. Memory cells used to store information within a memory may be organized into rows (word lines) and columns (bit lines). At various points in manufacturing and use of a memory device, one or more memory cells may fail (e.g., become unable to store information, be inaccessible by the memory device, etc.) and may need to be repaired. Some memory devices may include fuses that are programmed to redirect addresses of defective memory cells to redundant memory cells. When, during a fuse read operation, the states of the fuses are inaccurately read, redundant memory cells may be mapped to replace healthy memory cells and defective memory cells may be accessed normally, which may adversely affect the reliability of the memory.

DETAILED DESCRIPTION

This disclosure describes examples of detecting errors in fuse data read from programmed fuse arrays. A semiconductor device may use various configuration parameters or settings during power-up and operation, such as start-up parameters and settings, redundancy settings, options settings, identification (ID) settings, or any combination thereof. The configuration parameters may be used to specify operational characteristics, such as voltage levels, timing configurations, I/O and other bus configurations, etc. Some of the configuration parameters or settings may be associated with redundancy configurations, such as identifying which memory addresses are to be redirected from a defective row or column of memory cells to a redundant row or column of memory cells. The configuration parameters and settings may be stored in a fuse array. For various reasons, fuse data read from a fuse array may be erroneous, such as a defective fuse, unstable voltage levels, or another operational anomaly. To detect erroneous fuse data, a fuse error detection circuit may generate signature data for consecutive fuse read operations, and may compare the signature data to detect a difference. When a difference is detected, the fuse error detection circuit may provide a match signal indicating the detected error. When the match signal indicates the error, the semiconductor device may disable (e.g., suspend, discontinue, etc.) operation, or perform up to a specified number of additional fuse data read operations to verify whether the fuse data is unstable. Generating and comparing signature data of having few bits (e.g., 4, 8, 16, 32, 64, 128, etc.), rather than comparing complete fuse data sets of tens of thousands of bits, may reduce physical space consumption, as well as complexity, in detecting a fuse data error.

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
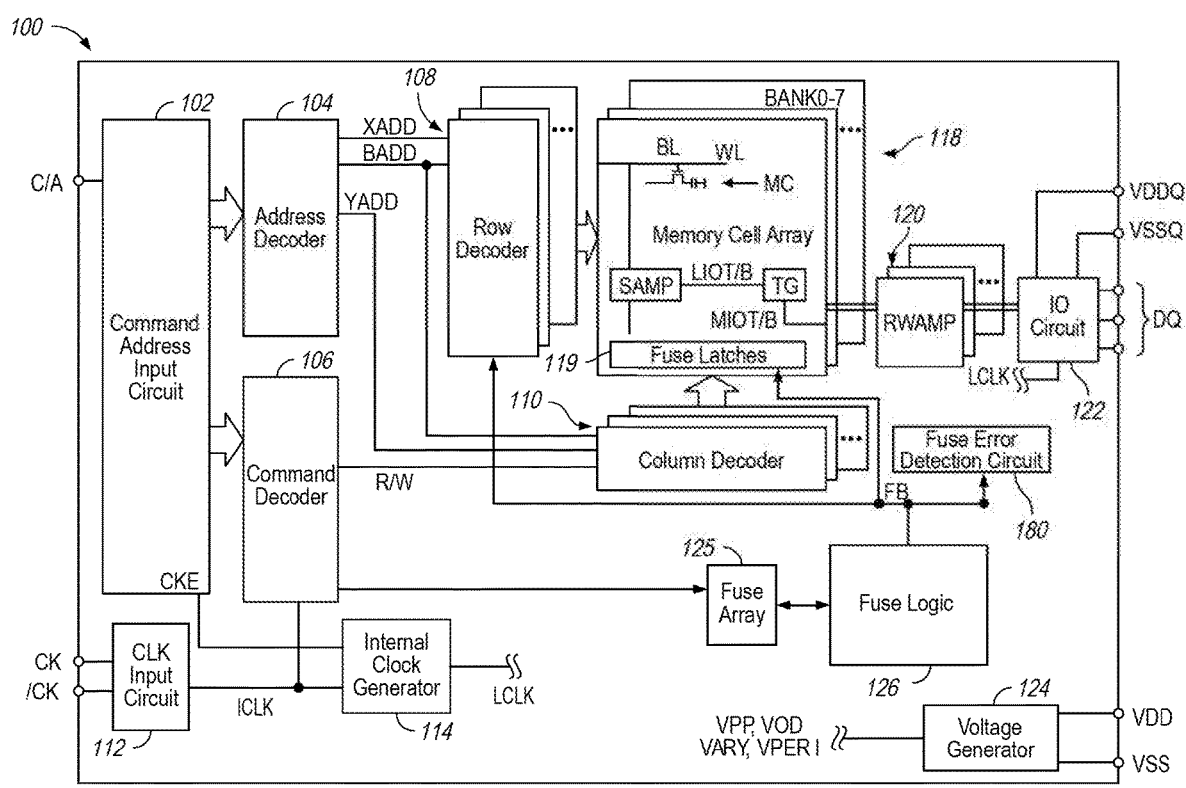
FIG. 1 is a block diagram of a semiconductor device according to an embodiment of the present disclosure.

FIG. 1 is a block diagram of a semiconductor device 100 according to an embodiment of the disclosure. The semiconductor device 100 may include a CLK input circuit 112, an internal clock generator 114, an address/command input circuit 102, an address decoder 104, a command decoder 106, a plurality of row (e.g., first access line) decoders 108, a memory cell array 118 including sense amplifiers SAMP and transfer gates TG, a plurality of column (e.g., second access line) decoders 110, read/write amplifiers 120, an input/output (I/O) circuit 120, a voltage generator circuit 124, a fuse array 125, fuse logic 126, and a fuse error detection circuit 180. The semiconductor device 100 may include a plurality of external terminals including address and command terminals C/A coupled to command/address bus, clock terminals CK and /CK, data terminals DQ, DQS, and DM, and power supply terminals VDD and VSS.

The memory cell array 118 includes a plurality of banks BANK0-7. In some examples, the memory cell array 118 may include more or fewer than 8 banks without departing from the scope of the disclosure. Each bank BANK0-7 may include a plurality of word lines WL, a plurality of bit lines BL, and a plurality of memory cells MC arranged at intersections of the plurality of word lines WL and the plurality of bit lines BL. The selection of the word line WL for each bank BANK0-N is performed by a corresponding row decoder 108 and the selection of the bit line BL is performed by a corresponding column decoder 110. The plurality of sense amplifiers SAMP are located for their corresponding bit lines BL and coupled to at least one respective local I/O line further coupled to a respective one of at least two main I/O line pairs, via transfer gates TG, which function as switches. The sense amplifiers SAMP and transfer gates TG may be operated based on control signals from decoder circuitry, which may include the command decoder 106, the row decoders 108, the column decoders 110, any control circuitry of the memory cell array 118 of the banks BANK0-7, or any combination thereof.

The command/address input circuit 102 may receive an address signal and a bank address signal from outside at the command/address terminals C/A via a command/address bus and transmit the address signal and the bank address signal to the address decoder 104. The address decoder 104 may decode the address signal received from the command/address input circuit 102 and provide a row address signal XADD to the row decoder 108, and a column address signal YADD to the column decoder 110. The address decoder 104 may also receive the bank address signal and provide the bank address signal BADD to the row decoder 108 and the column decoder 110.

The command/address input circuit 102 may receive a command signal from outside, such as, for example, a memory controller at the command/address terminals C/A via the command/address bus and provide the command signal to the command decoder 106. The command decoder 106 may decode the command signal and generate various internal command signals. For example, the internal command signals may include a row command signal to select a word line, or a column command signal, such as a read command or a write command, to select a bit line.

Accordingly, when a read command is issued and a row address and a column address are timely supplied with the read command, read data is read from a memory cell in the memory cell array 118 designated by the row address and the column address. The read/write amplifiers 120 may receive the read data DQ and provide the read data DQ to the IO circuit 122. The IO circuit 122 may provide the read data DQ to outside via the data terminals DQ. Similarly, when the write command is issued and a row address and a column address are timely supplied with the write command, and then the IO circuit 122 may receive write data at the data terminals DQ and provide the write data via the read/write amplifiers 120 to the memory cell array 118. Thus, the write data may be written in the memory cell designated by the row address and the column address.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 112. The clock input circuit 112 may receive the external clock signals and generate an internal clock signal ICLK. The clock input circuit 112 may provide the internal clock signal ICLK to an internal clock generator 114. The internal clock generator 114 may generate a phase controlled internal clock signal LCLK based on the received internal clock signal ICLK and a clock enable signal CKE from the command/address input circuit 102. Although not limited thereto, a DLL circuit may be used as the internal clock generator 114. The internal clock generator 114 may provide the phase controlled internal clock signal LCLK to the IO circuit 122. The IO circuit 122 may use the phase controller internal clock signal LCLK as a timing signal for determining an output timing of read data.

The power supply terminals may receive power supply voltages VDD and VSS. These power supply voltages VDD and VSS may be supplied to a voltage generator circuit 124. The voltage generator circuit 124 may generate various internal voltages, VPP, VOD, VARY, VPERI, and the like based on the power supply voltages VDD and VSS. The internal voltage VPP is mainly used in the row decoder 108, the internal voltages VOD and VARY are mainly used in the sense amplifiers SAMP included in the memory cell array 118, and the internal voltage VPERI is used in many other circuit blocks. The IO circuit 122 may receive the power supply voltages VDD and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 122.

In some examples, the semiconductor device 100 may use various configuration parameters or settings during power-up and operation, such as start-up parameters and settings, redundancy settings, options settings, identification (ID) settings, or any combination thereof. The configuration parameters may be used by the semiconductor device 100 to specify operational characteristics, such as voltage levels, timing configurations, I/O and other bus configurations, etc. Some of the configuration parameters or settings may be associated with redundancy configurations, such as identifying which memory addresses are to be redirected from a defective row or column of memory cells to a redundant row or column of memory cells.

The semiconductor device 100 may include the fuse array 125 that includes a plurality of programmable storage elements (e.g., fuses, anti-fuses, etc.) configured to store the configuration parameters and settings. The storage elements may include start-up (e.g., or power-up) storage elements, redundancy storage elements, options storage elements, identification (ID) storage elements, or any combination thereof.

During a fuse read operation, information programmed (e.g., stored) at the fuse array 125 (e.g., fuse data) may be provided along a fuse bus (FB) to the fuse logic 126. The fuse logic 126 may provide the fuse data to various components of the semiconductor device 100, such as the row decoder 108, and the memory cell array 118. For example, the memory cell array 118 may include fuse latches 119 that are each associated with a particular access line (e.g., wordline WL or bitline BL) of the memory cell array 118. The fuse latches 119 may read the fuse data to enable or disable access to respective memory cells along a respective row or column of the memory cell array 118. For example, a fuse latch of the fuse latches 119 may enable a redundant row or column of memory cells and a second fuse latch may disable a defective row or column of memory cells. The row decoder 108 may use the fuse data to determine which memory addresses should be directed to a redundant row or column of memory cells. Some of the fuse data may also be provided to circuits of the semiconductor device 100, such as the command decoder 106, the clock input circuit 112, the internal clock generator 114, the voltage generator 124, the IO circuit 122, etc.

In some examples, the fuse data may be divided into subsets of bits (e.g., subsets of data) that are serially broadcast from the fuse array 125 to the fuse logic 126 during a fuse read operation. The fuse logic 126 may latch each respective subset of bits of the fuse data from the fuse array 125, and may provide the respective subset of bits to the row decoder 108 and/or the memory cell array 118 via a fuse bus FB. A count of bits in the subset of bits may be based on a width of (e.g., number of channels or signal lines along) the fuse bus. The fuse array 125 and the fuse logic 126 may be clocked according to a select clock signal.

Because the fuse data may be used to configure operation of the semiconductor device 100, a fuse read operation may be performed early in a power-up sequence. In some examples, voltage levels early in a power-up sequence may be unstable. Unstable voltage levels may result in erroneous fuse data being read from the fuse array 125. Thus, the fuse array 125 may be read a second time later in the power-up sequence (e.g., after the voltage levels have had time to stabilize) to finalize configuration of the semiconductor device 100 before starting normal operation.

In some examples, such as when a fuse becomes defective or as a result of another operational anomaly, the fuse array 125 and/or the fuse logic 126 may read and provide erroneous fuse data to the row decoder 108 and/or the memory cell array 118, even after the voltage levels have had time to stabilize. The erroneous fuse data may adversely affect performance of the semiconductor device 100, in some examples.

To detect erroneous fuse data read from the fuse array 125, the fuse error detection circuit 180 may receive the respective first and second fuse data sets read during each of the first and second fuse read operations, respectively, from the fuse logic 126, and may perform a comparison of the first and second fuse data sets to detect differences. The fuse error detection circuit 180 may provide an output (e.g., a match) signal indicating whether the first and second fuse data sets match, in some examples.

In some examples, each fuse data set may include tens or hundreds of thousands of bits. Thus, in some embodiments, the fuse error detection circuit 180 may include a signature register configured to generate a signature value (e.g., signature data) corresponding to a fuse data set read during a fuse data read operation. The signature data may include significantly fewer bits than a total number of bits of the fuse data. Thus, implementing the fuse error detection circuit 180 to generate the signature data used for comparison of fuse data from two fuse read operations may reduce a size and complexity of the fuse error detection circuit 180, as compared with performing a bitwise comparison of every bit of the fuse data.

To perform a comparison between consecutive read operations, the signature register of the fuse error detection circuit 180 may generate first signature data associated with the first fuse data set and a second signature value associated with the second fuse data set. In some examples, the signature register may have a width or storage capacity that matches the fuse bus width. However, a signature register with a different width may be implemented without departing from the scope of the disclosure. The fuse error detection circuit 180 may be further configured to store the first signature value, such as in a storage register, during a second fuse data read operation.

The fuse error detection circuit 180 may compare (e.g., bitwise compare) the first and second signature data. In some examples, in response to a determination that the first signature value does not match the second signature value, the fuse error detection circuit 180 may provide the output signal having a value indicating a mismatch. In some examples, in response to the output signal indicating the mismatch, the semiconductor device 100 may disable (e.g., suspend, discontinue, etc.) operation. In some examples, in response to the output signal indicating the mismatch, the semiconductor device 100 may perform one or more subsequent fuse read operations until the fuse error detection circuit 180 detects matching signature values generated by consecutive fuse data sets. In some examples, the semiconductor device 100 may limit a number of fuse read operations without detecting a match to a specified number before disabling operation. In some examples, the signature register is a multiple input signature register (MISR). In some embodiments, the fuse error detection circuit 180 may be implemented using other implementations, such as circuitry configured to perform a cyclic redundancy check (CRC).

Figure 2:
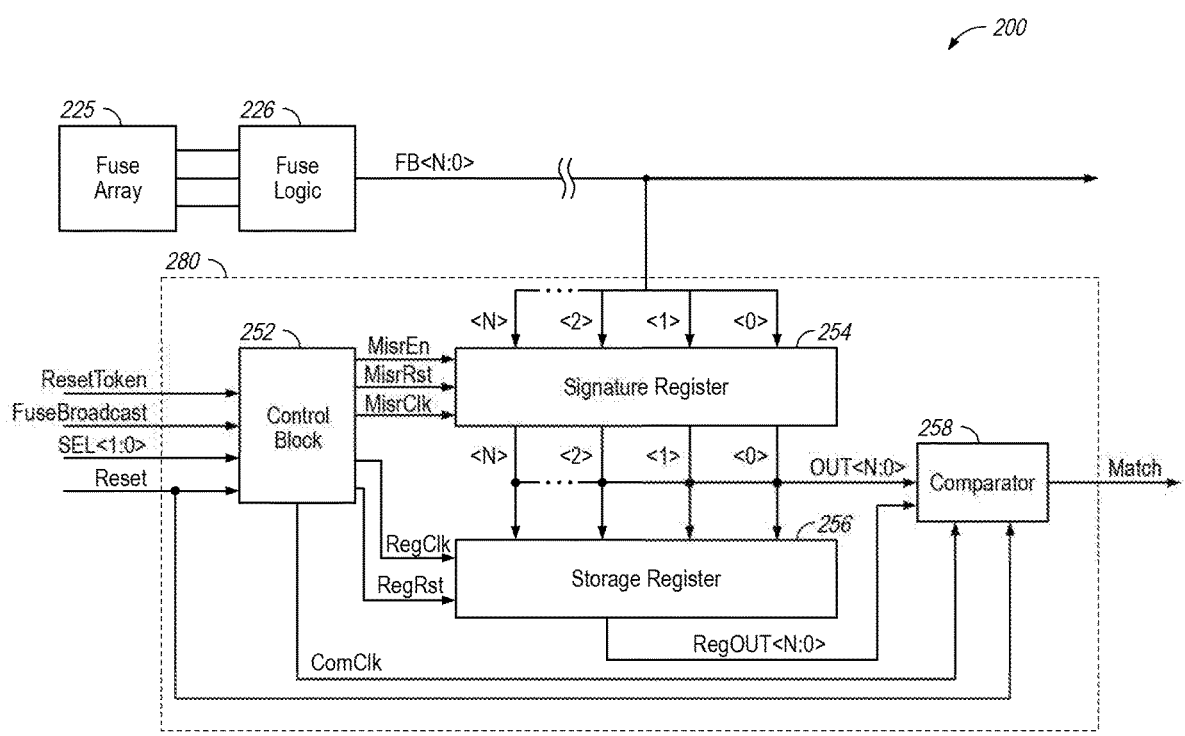
FIG. 2 is a block diagram of a portion of a semiconductor device according to an embodiment of the present disclosure.

FIG. 2 is a block diagram of a portion of a semiconductor device 200 according to an embodiment of the present disclosure. The fuse circuit 200 includes a fuse array 225, a fuse logic circuit 226, a fuse bus FB<N:0>, and a fuse error detection circuit 280. The fuse array 225, the fuse logic circuit 226, and the fuse error detection circuit 280 may represent implementations of the fuse array 125, the fuse logic circuit 226, the FB 128, and the fuse error detection circuit 180 respectively, of FIG. 1.

The fuse array 225 may include a plurality of storage elements, such as fuses or anti-fuses, configured to store fuse data. In some embodiments, the storage elements may include start-up storage elements, redundancy storage elements, options storage elements, identification (ID) storage elements, or any combination thereof. Each storage element may include a first state (e.g., un-programmed state) and a second state (e.g., programmed state). In some examples, some of the storage elements may be grouped together to provide a single configuration parameter or setting. For example, a group of redundancy storage elements may store an address that points to a defective row or column of memory cells in a memory array, which may be used by a row decoder and/or circuitry of a memory cell array to redirect the address to a redundant (e.g., or replacement) row or column of memory cells. The fuse data programmed in the fuse array 225 may be broadcast from the fuse array 225 to the fuse logic 226 during a fuse read operation. In some examples, the fuse data may be divided into subsets of fuse data, with the subsets of data broadcast serially according to a selection clock signal. A size of each of the subsets of fuse data may be based on a width of a fuse bus, such as the fuse bus FB<N:0>, where N is a positive integer. For example, each subset of fuse data may include N+1 bits. In some examples, N is equal to 3, 7, 15, 31, or 63 bits.

The fuse logic circuit 226 may receive and latch each subset of fuse data broadcast from the fuse array 225, and provide the latched subset of fuse data to a fuse bus FB<N:0>. The fuse bus FB<N:0> may provide the fuse data to other components (e.g., a row decoder, a memory cell array, etc.) (not shown) of the semiconductor device 200 in response to the selection clock. The fuse logic circuit 226 may include latch circuits or other volatile memory elements configured to temporarily store a subset of fuse data. In some examples, the fuse logic circuit 226 may include circuitry configured to perform a 'soft' repair of the received fuse data without changing programmed states of the fuse array 225.

The fuse error detection circuit 280 includes a control block 252, a signature register 254, a storage register 256, and a comparator circuit 258. The control block 252 may be configured to receive input signals to control operation of the fuse error detection circuit 280, including a reset token signal ResetToken configured to indicate a start of a new fuse data broadcast or an end of a previous fuse data broadcast, a fuse broadcast signal FuseBroadcast indicating a fuse broadcast, selection signals SEL<1:0> configured to clock fuse data on the fuse bus FB<N:0>, and a reset signal Reset configured to reset the fuse error detection circuit 280 (e.g., such as after a power cycle). In response to the received input signals, the control block 252 may be configured to provide signals to the signature register 256, the storage register 256, and the comparator circuit 258 to control operation thereof. For example, based on the input signals received by the control block 252, the control block 252 may be configured to provide a MISR enable signal MisrEn to enable the signature register 254, a MISR reset signal MisrRst to reset the signature register 254, and a MISR clock signal MisrClk to control latching of each subset of the fuse data on the fuse bus FB<N:0> at the signature register 254. The control block 252 may provide a register clock signal RegClk to control latching of signature data from the signature register 254 at the storage register and a register reset signal RegRst to reset the storage register 256 based on the received input signals. The control block 252 may also provide a command clock signal ComClk to control timing of the comparator circuit 258 and a reset signal Reset to rest the comparator circuit 258 based on the received signals.

The signature register 254 may be coupled to the fuse bus FB<N:0> to receive fuse data broadcast by the fuse logic 226 from the fuse array 225. In response to the MisrClk signal, the signature register 254 may be configured to generate (e.g., encode) a new (e.g., updated) signature value based on a combination of the current signature data and each respective subset of fuse data received at an input from the fuse bus FB<N:0>. The signature register 254 may have a width equal to a width of the fuse bus FB<N:0> (e.g., N+1 bits), in some examples. Thus, the signature register 254 may iteratively update the current signature data with each new subset of fuse data provided on the fuse bus FB<N:0>. The signature data may be indicative of a value of an entirety of the fuse data or a subset of values of the fuse data. For example, known "bad" or defective fuses or fuses that are associated with unused redundancy fuse sets may be excluded from the fuse data provided to the signature register 254 to generate the signature data. In addition, some fuse sets may include fewer fuses than a width of the fuse bus FB<N:0>. In this example, the signature register may ignore the unused bits of the fuse bus FB<N:0> for that particular fuse set read when updating the signature data. In some examples, the fuse data received at the signature register 254 may be data provided from an output of a logic circuit that is configured to provide a logical expression the fuse data. The signature register 254 may provide the signature data via output signals OUT<N:0> to the storage register 256 and the comparator circuit 258. In some examples, the signature register 254 includes a multiple input signature register (MISR).

The storage register 256 is configured to receive the signature data from the storage register 256, and to latch (e.g., store) the signature data in response to the RegClk signal. Operation of the RegClk signal may be responsive to an end of a fuse data broadcast or a start of a new fuse data broadcast. As such, the storage register 256 may store the signature data corresponding to a previous fuse data broadcast while the signature register generates new signature data corresponding to a current or new fuse data broadcast. The signature register 254 may have a width equal to a width of the fuse bus FB<N:0> (e.g., N bits), in some examples. The storage register 256 may provide the stored signature data via output signals RegOut<N:0> to the comparator. In some embodiments, the fuse error detection circuit 280 may be implemented with more than one storage register to store more than one set of previous signature data.

The comparator circuit 258 receives signature data from the signature register 254 via the OUT<N:0> signals (e.g., first signature data) and stored signature data from the storage register 256 via the RegOUT<N:0> signals (e.g., second signature data). The comparator circuit 258 is configured to a bitwise comparison between the first signature data and the second signature data to detect a mismatch. A mismatch between the first signature data and the second signature data may indicate that the fuse data from one or both of the fuse data broadcasts is erroneous. In response to the ComClk signal, the comparator circuit 258 may set the Match signal to a value based on the comparison. For example, the comparator circuit 258 may set the match signal to a first value in response to the comparison indicating a match between the first and second signature data, and may set the match signal to a second value in response to the comparison indicating a mismatch between the first and second signature data.

During a fuse read operation, fuse data programmed (e.g., stored) at the fuse array 225 (e.g., fuse data) may be serially broadcast to the fuse logic 226 in subsets of fuse data. The fuse logic 226 may provide the fuse bus FB<N:0>, which provides the data to other components (not shown) of the semiconductor device 200. In some examples, such as when a fuse becomes defective or as a result of another operational anomaly, the fuse array 225 and/or the fuse logic 226 may provide erroneous fuse data to the fuse bus FB<N:0>. Erroneous fuse data may also be broadcast during a fuse read operation performed early in a power-up sequence before voltage levels have sufficiently stabilized. The erroneous fuse data may adversely affect performance of the semiconductor device 200, in some examples.

To detect erroneous fuse data, the fuse error detection circuit 280 may be configured to determine whether fuse data broadcast during consecutive fuse read operations are mismatched. Thus, early in a power-up sequence (e.g., in response to the Reset signal), the comparator circuit 258 may reset the Match signal, and the control block 252 may be configured to initialize the signature register 254 and the storage register 256 via the MisrRst and the RegRst signals, respectively, to default values. In some examples, the default values may be all zeroes. In another example, the default values may be the same or different predetermined values.

When the fuse broadcast signal transitions to a logical value indicating a fuse broadcast (e.g., a first logical value), the control block 252 may be configured to enable the signature register via the MisrEn signal. During a first fuse data broadcast, subsets of data are serially provided to the fuse bus FB<N:0> in response to the SEL<1:0> signals. Thus, also in response to each pulse on the SEL<1:0> signals, the control block 252 may be configured to cause the signature register 254 to update current signature data by toggling the MisrClk signal. In response to each toggle of the MisrClk, the signature register 256 may combine current signature data with the subset of data on the fuse bus FB<N:0> to generate updated signature data. In some examples, if a logical value or result of the subset of data on the fuse bus FB<N:0> indicates the subset of data should be ignored, the current signature data may be provided as the updated signature data (e.g., the current signature data may be unchanged).

A pulse may be provided on the ResetToken signal to indicate that the first fuse data broadcast is complete (e.g., or that a next fuse data broadcast is starting). In response to the pulse on the ResetToken signal, the control block 252 may toggle the RegClk signal to cause the storage register 256 to store (e.g., latched) the current signature data (e.g., first signature data) provided from the signature register 254 (e.g., the first signature data coarsening to the first fuse data broadcast). In addition, after the current signature data is stored at the storage register 256, the control block 252 may also cause the signature register 254 to reset to a default value via the MisrRst signal. In some examples, the default value may be all zeroes. In another example, the default value may be a predetermined value.

During a second fuse data broadcast, subsets of fuse data are serially provided to the fuse bus FB<N:0> in response to the SEL<1:0> signals. Thus, also in response to the SEL<1:0> signals, the control block 252 may again cause the signature register 254 to update current signature data by toggling the MisrClk signal. In response to each toggle of the MisrClk, the signature register 256 may combine current signature data with the subset of data on the fuse bus FB<N:0> to generate updated signature data.

The FuseBroadcast signal may transition to a logical value indicating an end of the fuse broadcast (e.g., a second logical value). At this point, the signature register 254 may provide the signature data from the second fuse data broadcast (e.g., the second signature data) via the OUT<N:0> signals and the storage register may provide the first signature data to the comparator via the RegOUT<N:0> signals. The comparator circuit 258 may perform a bitwise comparison of the first signature data and the second signature data to provide an indication of a match. In response to the transition of the FuseBroadcast signal, the control block 252 may toggle the ComClk signal to cause the comparator to transition the indication of the match to the Match signal.

Thus, in response to a determination that the first signature value does not match the second signature value, the comparator circuit 258 may provide the Match signal having a value indicating a mismatch. Otherwise, the comparator may provide the Match signal having a value indicating a Match. In some examples, in response to the Match signal indicating the mismatch, the semiconductor device 200 may disable operation. In some examples, in response to the output signal indicating the mismatch, the semiconductor device 200 may perform one or more subsequent fuse read operations until the fuse error detection circuit 280 detects matching signature values generated by consecutive fuse data sets. In some examples, the semiconductor device 200 may limit a number of fuse read operations without detecting a match to a specified number before disabling operation. In some embodiments, the fuse error detection circuit 280 may be implemented using other implementations, such as circuitry configured to perform a cyclic redundancy check (CRC) as the signature-type of data.

Figure 3:
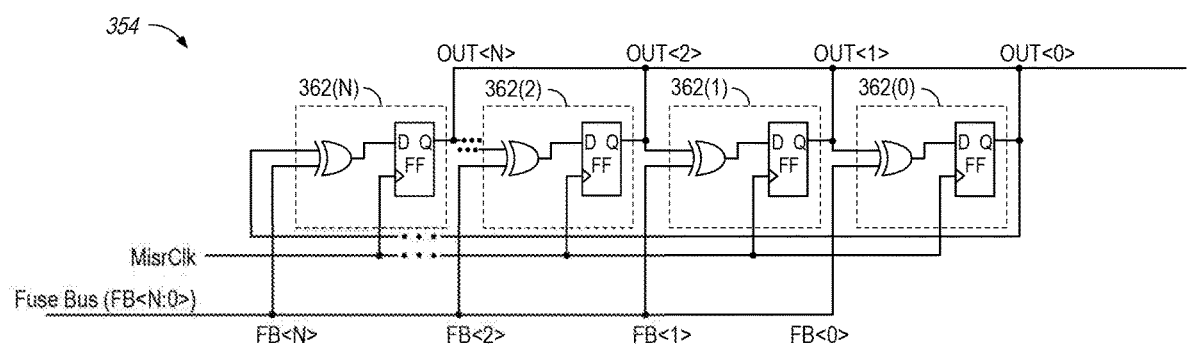
FIG. 3 is a schematic diagram of a fuse error detection circuit according to an embodiment of the present disclosure.

FIG. 3 is a schematic diagram of an example signature register 354 according to an embodiment of the present disclosure. The signature register 354 may represent an implementation of a signature register of the fuse error detection circuit 180 of FIG. 1 and/or the signature register 254 of FIG. 2. In some examples, the fuse bus FB of FIG. 1 and/or the fuse bus FB<N:0> may implement the fuse bus FB<N:0>. In some examples, the MisrClk and OUT<N:0> signals of FIG. 2 may implement the MisrEn and OUT<N:0> signals, respectively.

The signature register 354 includes a plurality of signature cells 362(0)-362(N) each configured to receive respective fuse bus FB<N:0> data and respective output data from one preceding (e.g., adjacent, sequential, succeeding, etc.) signature cell of the signature cells 362(0)-362(N), with the signature cell 362(N) receiving the output data receiving output data from the signature cell 362(0). Each of the signature cells may include an exclusive OR gate XOR coupled to a flip-flop FF. The XOR gates may each be configured to perform an XOR operation on the respective bit of fuse bus FB<N:0> data and the output data from the adjacent signature cell to provide a signal to an input D of the respective flip-flop. In response to the MisrClk, each flip-flop may be configured to propagate the output of the respective XOR gate to a respective output Q. The respective output of each of the signature cells 362(0)-362(N) may be provided to the succeeding (e.g., adjacent, sequential, preceding, etc.) signature cell of the signature cells 362(0)-362(N) and to an output bus OUT<N:0>. Thus, rather than updating an output of a signature cell based only on respective input data from the fuse bus FB<N:0>, each of the signature cells 362(0)-362(N) updates output data based on an XOR combination of respective input data from the fuse bus FB<N:0> and output data from a preceding signature cell. As this process using an XOR logic combination to derive the signature data continues over the course of thousands of bits of the fuse data, if even a single bit of fuse data is different between two fuse read operations, the signature provided by the signature register 354 may also be different, which may allow detection of an error with far fewer bits than performing a bitwise comparison on all of the fuse data.

While FIG. 3 depicts that the output of the signature cell 362(0) being provided to an XOR gate of the signature cell 362(N) to be XOR'd with the fuse bus FB<N> signal, additionally or alternatively, the output of the signature cell 362(0) may be fed back to an additional XOR gate configured to perform an XOR logic operation between the output of the signature cell 362(1) and the output of the signature cell 362(0). The output of the additional XOR gate provided to an input of the XOR gate of the signature cell 362(0) (e.g., replacing the output of the signature cell 362(1)) and the XOR gate of the signature cell 362(0) may be configured to perform an XOR logic operation between the fuse bus FB<0> signal and the output of the additional XOR gate.

Figure 4:
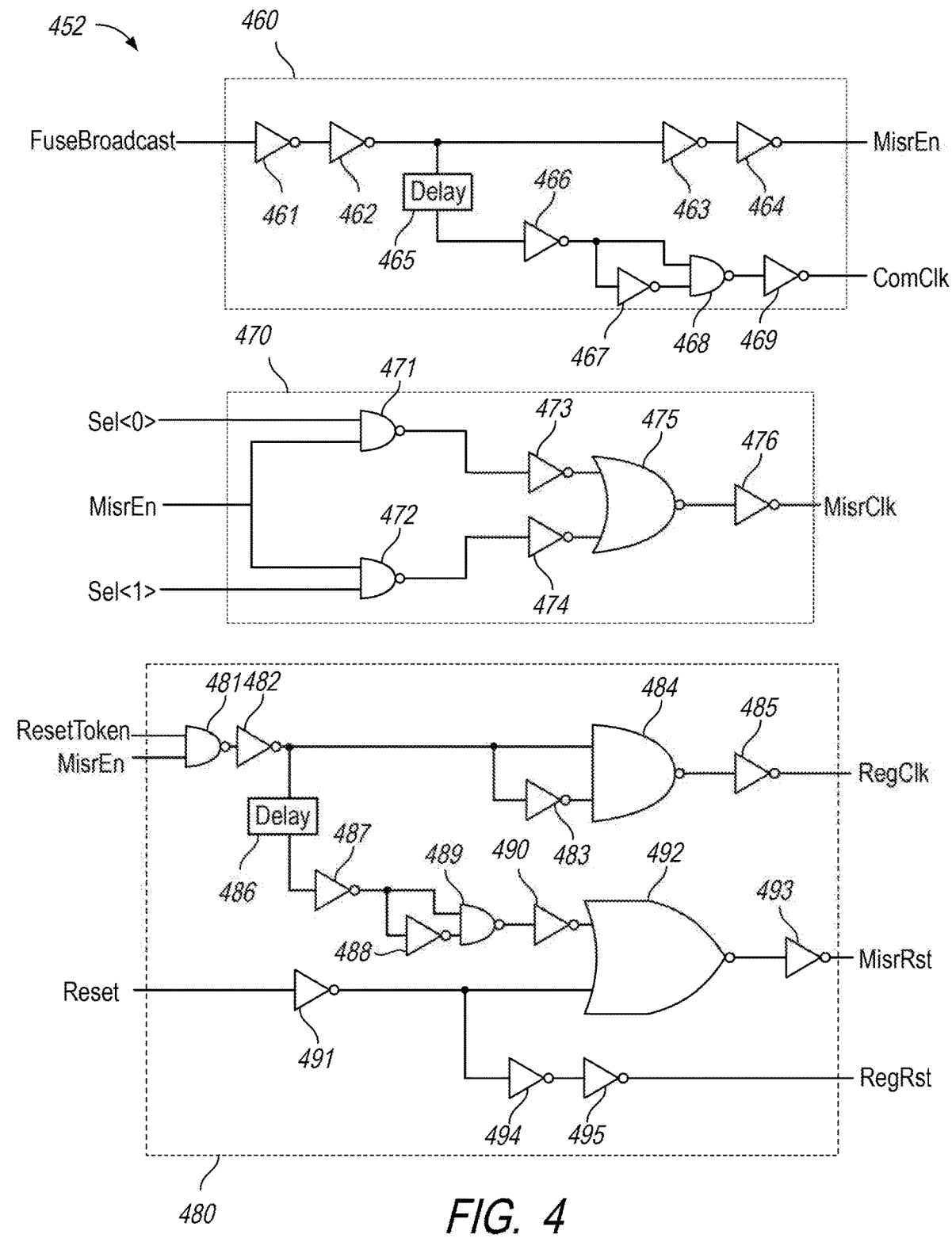
FIG. 4 is a schematic diagram of a control block according to an embodiment of the present disclosure.

FIG. 4 is a schematic diagram of a control block 452 according to an embodiment of the present disclosure. The control block 452 may represent an implementation of the control block 252 of FIG. 2. In some examples, the fuse bus FB of FIG. 1 and/or the fuse bus FB<N:0> may implement the fuse bus FB<N:0>. In some examples, the FuseBroadcast, the SEL<1:0>, the ResetToken, the Reset, the MisrClk, the MisrEn, the MisrRst, the RegClk, the RegRst, and the ComClk signals of FIG. 2 may implement the FuseBroadcast, the SEL<1:0>, the ResetToken, the Reset, the MisrClk, the MisrEn, the MisrRst, the RegClk, the RegRst, and the ComClk signals, respectively.

The control block 452 may include a first logic circuit 460, a second logic circuit 470, and a third logic circuit 480. The first logic circuit 460 may be configured to receive a fuse broadcast signal FuseBroadcast and provide a MisrEn signal and a ComClk signal based on the FuseBroadcast signal. The first logic circuit 460 may include serially-coupled inverters 461, 462, 463, and 464 configured to receive the FuseBroadcast signal and provide the MisrEn signal having a logical value that is the complement of the logical value of the FuseBroadcast signal. The first logic circuit 460 may further include logic circuitry to provide a pulse on the ComClk signal in response to the FuseBroadcast via a delay circuit 465, inverter 466, inverter 467, NAND gate 468, and inverter 469. The length of the pulse on the ComClk signal may be based on a transition delay through the inverter 467.

The second logic circuit 470 may be configured to provide a MisrClk signal based on the MisrEn signal from the first logic circuit 460 and selection clock signals SEL<1:0>. The second logic circuit 470 includes a first NAND gate 471 coupled in series with a first inverter 473 to provide a first input to a NOR gate 475 based on the MisrEn and SEL<0> signals and a second NAND gate 472 coupled in series with a second inverter 474 to provide a second input to the NOR gate 475 based on the MisrEn and SEL<1> signals. The MisrClk signal may be provided based on an inverted output (via inverter 476) of the NOR gate 475.

The third logic circuit 480 may be configured to provide RegClk, MisrRst, and RegRst signals based on ResetToken, MisrEn (from the first logic circuit 460), and Reset signals. The third logic circuit 480 includes first circuitry configured to provide a pulse on the RegClk signal based on the ResetToken and MisrEn signals, including a NAND gate 481 coupled in series with an inverter 482 and configured to provide an output based on the ResetToken and MisrEn signals and an inverter 483 and a NAND gate 484 each coupled to an output of the inverter 482. The output of the inverter 483 is also coupled to the NAND gate 484. The pulse on the RegClk signals is provided as an inverted output (via inverter 485) of the NAND gate 484. The length of the pulse on the RegClk signal is based on a transition delay of the inverter 483.

The third logic circuit 480 includes second circuitry configured to provide the MisrRst signal based on the ResetToken, MisrEn, and Reset signals. The second circuitry includes a delay 486 coupled between an output of the inverter 482 and an inverter 487 and configured to delay an output of the inverter 482. The output of the inverter 487 is coupled to each of an inverter 488 and a NAND gate 489. The output of the inverter 488 is also coupled to an input of the NAND gate 489. The inverter 488 and the NAND gate 489 are configured to provide a pulse on the MisrRst signal (e.g., to reset a signature register between fuse read operations). An inverted output (via inverter 490) is provided to a first input of a NOR gate 492. An inverted (via inverter 491) Reset signal is provided to a second input of the NOR gate 492. The MisrRst signal is provided as an inverted output (via inverter 493) of the NOR gate. The first logic circuit 460 may include serially-coupled inverters 491, 494, and 495 configured to receive the Reset signal and provide the RegRst signal having a logical value that is the complement of the logical value of the Reset signal.

Thus, in operation, the first logic circuit 460 is configured to provide the MisrEn signal to enable a signature register (e.g., the signature register 254 of FIG. 2 and/or the signature register 354 of FIG. 3) when the FuseBroadcast signal indicates a fuse broadcast is active. The first logic circuit 460 is further configured to provide a pulse on the ComClk signal to cause a comparator (e.g., the comparator circuit 258 of FIG. 2) to update a value on the Match signal in response to the FuseBroadcast indicating an end of a fuse broadcast sequence.

Figure 5:
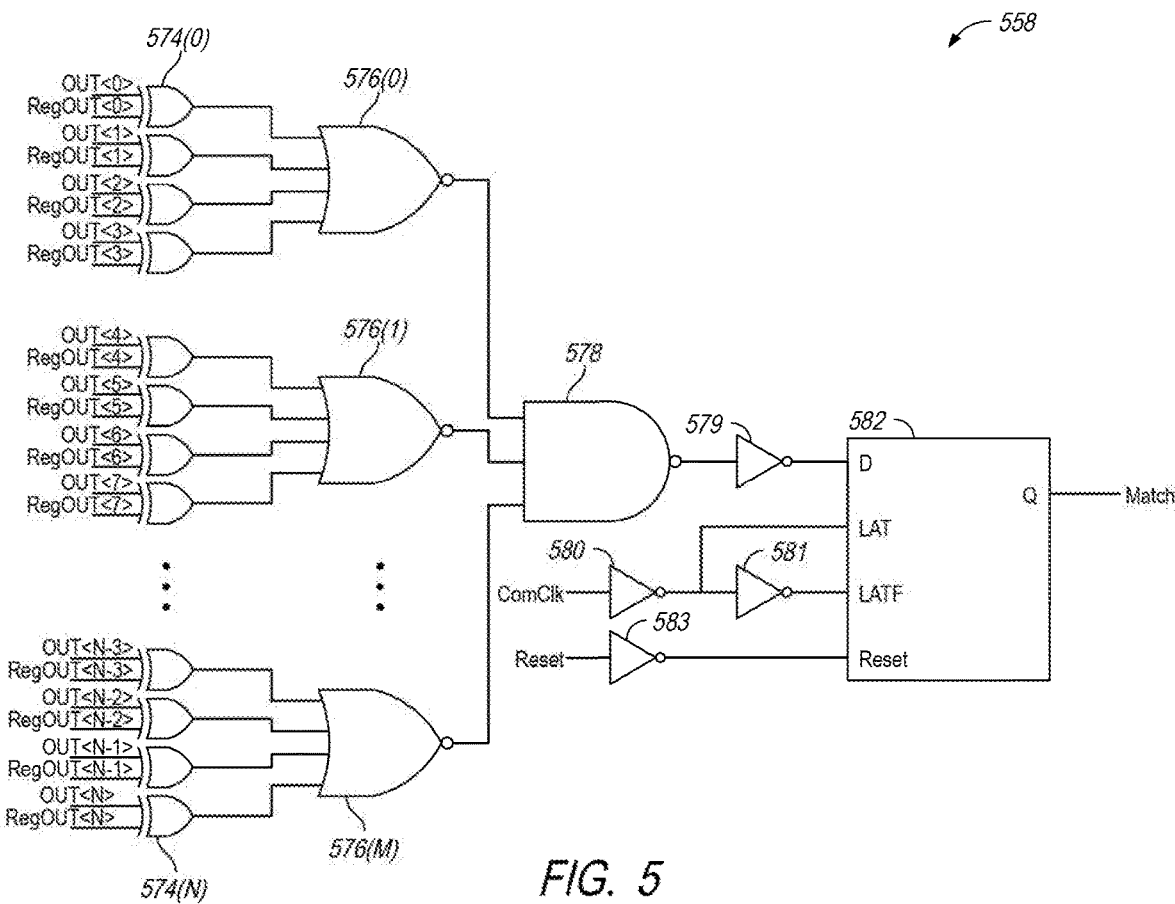
FIG. 5 is a schematic diagram of a comparator circuit according to an embodiment of the present disclosure.

The second logic circuit 470 is configured to provide pulses on the MisrClk signal when the MisrEn signal enables the signature register in response to both of the SEL<1:0> signals. The third logic circuit 480 is configured to provide a pulse on the RegClk signal in response to the ResetToken signal when the MisrEn signal enables the signature register. The third logic circuit 480 is further configured to provide a delayed (e.g., relative to the pulse on the RegClk signal) pulse on the MisrReset signal in response to the ResetToken signal when the MisrEn signal enables the signature register. The delayed pulse on the MisrRst signal relative to the pulse on the RegClk signal may allow the storage register (e.g., the storage register 256 of FIG. 2) to latch the current value of the signature register before the signature register value is reset. The third logic circuit 480 may also provide hard resets on the MisrRst and RegRst signals in response to the Reset signal, such as after a power cycle. 10521 FIG. 5 is a schematic diagram of a comparator circuit 558 according to an embodiment of the present disclosure. The comparator circuit 558 may represent an implementation of a comparator circuit of the fuse error detection circuit 180 of FIG. 1 and/or the comparator circuit 258 of FIG. 2. In some examples, the OUT<N:0>, the RegOUT<N:0>, the ComClk, the Reset, and the Match signals of FIG. 2 may implement the OUT<N:0>, the RegOUT<N:0>, the ComClk, the Reset, and the Match signals, respectively.

The comparator circuit 558 includes XOR gates 574(0)-574(N), NOR gates 576(0)-576(M), a NAND gate 578, and a flip-flop (FF) or latch circuit 582. The XOR gates 574(0)-574(N) may perform a bitwise comparison between individual ones of the output signals OUT<N:0> and individual ones of the register output signals RegOut<N:0>. The NOR gates 576(0)-576(M) may performing bitwise comparisons of the outputs of respective subsets of the XOR gates 574(0)-574(N). The NAND gate 578 may apply NAND logic to the outputs of the NOR gates 576(0)-576(M). The output of the NAND gate 578 may be inverted via the inverter 579 and provided to an input of the flip-flop circuit 582. The flip-flop circuit 582 may be controlled by the command clock signal ComClk and a complement of the command clock signal ComClk received via inverters 580 and 581. The flip-flop circuit 582 provides a match signal Match based on the output of the inverter 579. The flip-flop circuit 582 may reset the Match signal in response to the Reset signal received via inverter 484. Thus, in response to the ComClk signal, the comparator circuit 558 is configured to set the Match signal based on a bitwise comparison between the output signals OUT<N:0> and the register output signals RegOut<N:0>.

Figure 6:
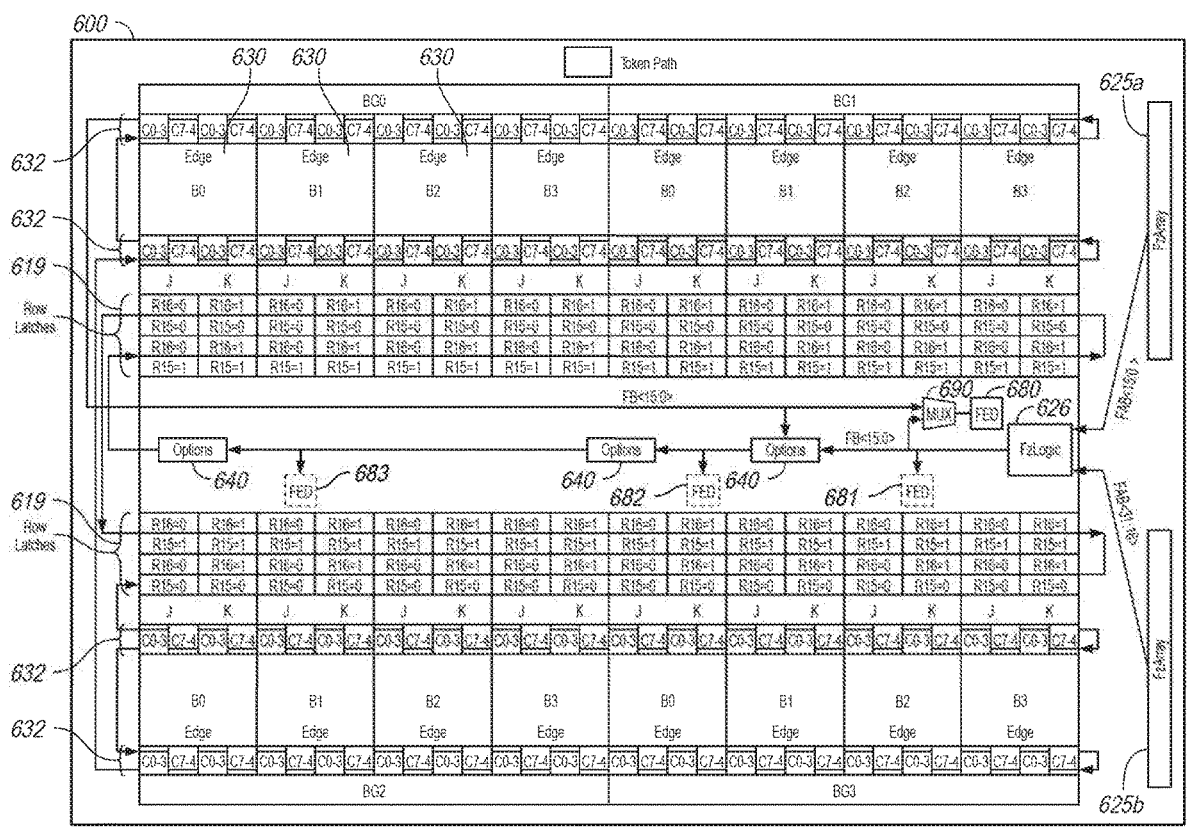
FIG. 6 is a block diagram representing a memory device according to an embodiment of the present disclosure.

FIG. 6 is a block diagram representing a memory device according to an embodiment of the present disclosure. FIG. 6 shows the transmission path of a fuse bus 628 from a pair of fuse arrays 625a and 625b through a memory array 600. In some embodiments, the memory array 600 may be an implementation of the memory cell array 118 of FIG. 1. However, the memory array 600 includes 16 banks 630 rather than the eight banks previously described with reference to the memory array 118. The 16 banks 630 are organized into four bank groups (BG0-BG3) of four banks 630 each. Each of the banks 630 is associated with a set of row latches 619 and column latches 632.

Addresses may be scanned out as part of fuse data along a fuse array buses FAB<15:0> and FAB<31:16> from the fuse arrays 625a-b, respectively, to the fuse bus FB<15:0> via the fuse logic 626. In the particular embodiment of FIG. 6, there may be a pair of fuse arrays 625a and 625b. The fuse array 625a may include a set of anti-fuses which may generally be used to store address information for a first portion of row addresses. The fuse array 625b may include a set of fuses which may generally be used to store address information for a second portion of row addresses. In some embodiments, the row addresses may be divided between the first portion and the second portion based on a numerical value assigned to the address. For example, the addresses may be sorted by numerical value, row addresses with the smaller values may be assigned to fuse array 625a, while row addresses with the larger values assigned to fuse array 625b. Since the value of the address may be expressed as a number in binary, for numbers with a high value, most of the bits of the number may be at a high logical level, while numbers with a low value may have most of the bits at a low logical level. Thus, it may be more efficient to store high value addresses in the fuse array 625b, which includes fuses that default to a high logical level and low value addresses in the fuse array 625a, which includes anti-fuses which default to a low logical level. Thus, a high value address assigned to the fuse array 625b may require less fuses to be blown than it would require anti-fuses to be blown in the fuse array 625a.

In some embodiments, the fuse array 625a may include anti-fuses, and may be a non-inverting fuse array (since the default value of the anti-fuses is a low logical level) and the fuse array 625b may include fuses and be an inverting fuse array. In some embodiments, it may be necessary to 'invert' an address (e.g., swap low logical levels for high logical levels and vice versa) provided from the inverting fuse array 625b.

While the organization of fuse arrays 625a and 625b will continue to be discussed herein as an example implementation, it should be understood that other methods of organizing addresses in the fuse array(s) may be used in other embodiments. For example, a single fuse array may be used with only fuses, only anti-fuses, or a mix thereof.

During a broadcast operation, the fuse arrays 625a-b may broadcast fuse data along the fuse array buses FAB<15:0> and FAB<31:16>, which may include the row addresses stored in the fuse arrays 625a-b. In the particular embodiment of FIG. 6, during the broadcast operation the fuse logic circuit 626 may receive a portion of the addresses along fuse array bus FAB<15:0> from the fuse array 625a, and a portion of the addresses along fuse array bus FAB<31:16> from the fuse array 625b. The fuse logic circuit 626 may combine the addresses onto the fuse bus FB<15:0> by alternating whether the addresses from the fuse array bus FAB<15:0> or the fuse array bus FAB<31:16> are provided along the fuse bus FB<15:0>. For clarity, the addresses provided along the fuse array bus FAB<15:0> may be referred to as 'even' addresses and the addresses provided along the fuse array bus FAB<31:16> may be referred to as 'odd' addresses. It should be understood that even and odd addresses refers to the fuse array 625a-b the address is stored in, and that both fuse array buses FAB<15:0> and FAB<31:16> may include addresses with numerical values which are both even and odd.

The fuse logic circuit 626 may provide data along the fuse bus FB<15:0>. The fuse logic circuit 626 may alternate between providing the even addresses from fuse array bus FAB<15:0> and the odd addresses from the fuse array bus FAB<31:16> along the fuse bus FB<15:0>. The fuse logic circuit 626 may also perform one or more operations based on the data of the fuse bus. For example, if one of the fuse arrays 625a-b is an inverting fuse array, the fuse logic circuit 626 may invert the value of addresses provided from the inverting fuse array.

The fuse bus FB<15:0> may pass data through one or more options circuits 640. The options circuits 640 may include various settings of the memory which may interact with the addresses along the fuse bus FB<15:0>. For example, the options circuits 640 may include fuse settings, such as the test mode and power supply fuses. Data stored in the fuse arrays 625a-b may be latched and/or read by the options circuits 640, which may then determine one or more properties of the memory based on the options data provided along the fuse bus 628.

After passing through the options circuits 640, the fuse bus FB<15:0> may pass through the row latches 619 for all of the memory banks 630 before passing through the column latches 632 for all of the memory banks 630. As well as providing fuse data (including address data) along the fuse bus FB<15:0>, the fuse logic circuit 626 may also provide one or more select signals along the fuse bus FB<15:0>. The select signals may be associated with a particular packet of data along the fuse bus, and may determine which circuit along the fuse bus FB<15:0> the particular packet of data is associated with. For example, if a row latch select signal is in an active state, it may indicate that the packet of data is to be stored in a row latch 619. In some embodiments, this may overwrite an address already stored in the row latch 619 with the address from the fuse bus FB<15:0>. Further select signals may be used to specify a particular location of the specific row latch 619 which is intended to store the packet of data (e.g., a bank group select signal, a bank select signal, etc.).

By monitoring the data on the fuse bus FB<15:0>, providing specific select signals, and selectively altering certain data on the fuse bus FB<15:0>, the fuse logic circuit 626 may perform a variety of repair operations on the memory. The row latches 619 and the column latches 632 may receive and store an address provided during a repair operation, and the memory may direct access operations based on the address(es) stored in the row and column latches, and on an enable state stored therein.

The fuse data along the fuse bus FB<15:0> may also be provided to one or more fuse error detection circuits 680-683 disposed along the fuse bus FB<15:0> at different locations. More or fewer than the 4 fuse error detection circuits 680-683 may be included in the memory device of FIG. 6 without departing from the scope of the disclosure. In some embodiments, the fuse error detection circuits 680-683 may each implement the fuse error detection circuit 180 of FIG. 1, the fuse error detection circuit 280 of FIG. 2, the signature register 354 of FIG. 3, the control block 452 of FIG. 4, the comparator circuit 558 of FIG. 5, or any combination thereof. A multiplexer 690 may be coupled to the fuse bus FB<15:0> at an output of the fuse logic 626 (e.g., near a first end), and to the fuse bus FB<15:0> after propagation through the column latches 632 (e.g., near a second end). The multiplexer 690 may be configured to selectively provide fuse data from one of the first end or the second end of the fuse bus FB<15:0> to the fuse error detection circuit 680. While FIG. 6 depicts the fuse bus FB<15:0> having 16 bits, the fuse bus FB may include more or fewer than 16 bits without departing from the scope of the disclosure.

Each of the fuse error detection circuits 680-683 may be configured to generate and store signature data based on received fuse data from the fuse bus FB<15:0> over at least two consecutive fuse data broadcasts, and perform a comparison between the two signatures to detect differences. A difference between two signatures may indicate an error in the fuse data. Having multiple fuse error detection circuits 680-683 disposed along the fuse bus FB<15:0> at various different locations may facilitate detection of a fuse data error, as well as provide an indication as to where the fuse data error is introduced, such as from the fuse arrays 625a-b, the fuse logic 626, one of the options blocks 640, the row latches 619, the column latches 632, etc.

Figure 7:
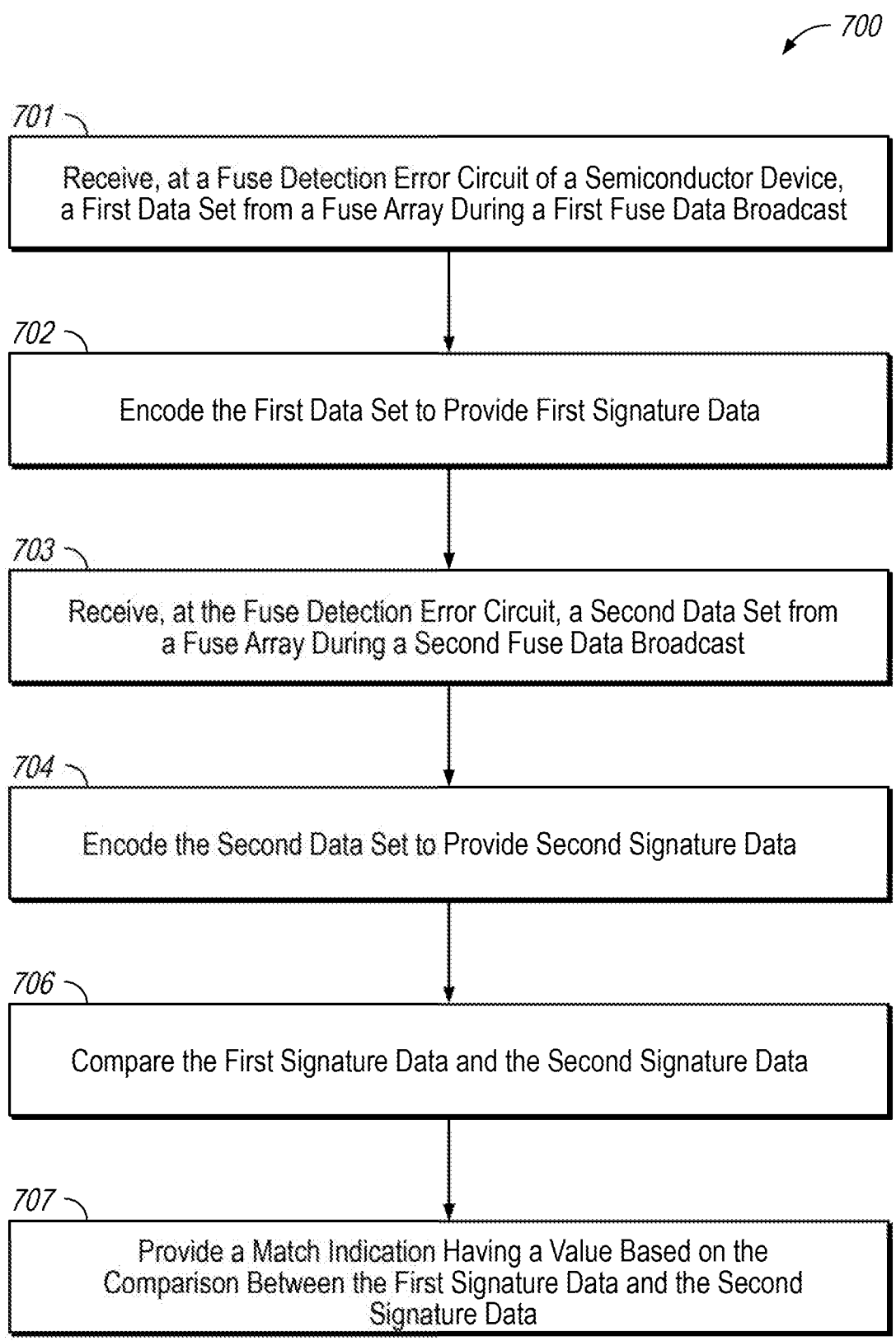
FIG. 7 is a flow diagram of a method to detect fuse errors, in accordance with an embodiment of the present disclosure.

FIG. 7 is a flow diagram of a method to detect fuse errors, in accordance with an embodiment of the present disclosure. The method 700 may be performed, at least in part, by the fuse error detection circuit 180 of Figure I, the fuse error detection circuit 280 of FIG. 2, the signature register 354 of FIG. 3, the control block 452 of FIG. 4, the comparator circuit 558 of FIG. 5, one or more of the fuse error detection circuits 680-683 of FIG. 6, or any combination thereof.

The method 700 may include receiving, at a fuse error detection circuit of a semiconductor device, a first data set from a fuse array during a first fuse data broadcast, at 701. The method 700 may include encoding the first data set to provide first signature data, at 702. In some examples, the method 700 may include encoding the first data set via a signature register, such as the signature register 254 of FIG. 2 or the signature register 354 of FIG. 3. In some examples, the method 700 may further include serially receiving subsets of the first data set, and updating the first signature data based on each received subset of the first data set. In some examples, the first signature data includes fewer bits than the first data set. In some examples, the method 700 may further include storing the first signature data, such as in a storage register (e.g., the storage register 256 of FIG. 2.

The method 700 may include receiving, at the fuse error detection circuit, a second data set from the fuse array during a second fuse data broadcast, at 703. The method 700 may include encoding the second data set to provide second signature data, at 704. In some examples, the method 700 may include encoding the second data set via the signature register. In some examples, the method 700 may further include serially receiving subsets of the second data set, and updating the first signature data based on each received subset of the first data set. In some examples, the first signature data includes fewer bits than the first data set.

The method 700 may include comparing the first signature data and the second signature data, at 706. The comparison may be performed via a comparator circuit, such as the comparator circuit 258 of FIG. 2 and/or the comparator circuit 558 of FIG. 5. In some examples, the method 700 may further include preforming a bitwise XOR comparison between the first signature data and the second signature data. The method 700 may include providing a match indication having a value based on the comparison between the first signature data and the second signature data, at 707. The match indication may include a match signal, such as the Match signal of FIGS. 2 and 5. In some examples, the method 700 may further include, in response to the match indication indicating a mismatch between the first signature data and the second signature data, causing a third fuse data broadcast or causing the semiconductor device to suspend operation.

Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. An apparatus comprising:
a fuse error detection circuit configured to receive a first data set from a fuse array during a first fuse data broadcast, wherein the first data set is based at least in part on data programmed in the fuse array, and to encode the first data set based at least in part on current signature data and the received first data set to provide first signature data, wherein the fuse error detection circuit is further configured to receive a second data set from the fuse array during a second fuse data broadcast, wherein the second data set is based at least in part on data programmed in the fuse array, and to encode the second data set based at least in part on the first signature data and the received second data set to provide second signature data, wherein the fuse error detection circuit is further configured to compare the first signature data and the second signature data and to provide a match indication having a value based on the comparison between the first signature data and the second signature data.

2. The apparatus of claim 1, wherein the fuse error detection circuit includes a signature register configured to receive the first data set and to encode the first data set to provide the first signature data.

3. The apparatus of claim 2, wherein the signature register is a multiple-input signature register configured to iteratively receive and encode respective subsets of the first data set to provide the first signature data, wherein the first signature data includes fewer bits than the first data set.

4. The apparatus of claim 2, wherein the signature register is further configured to receive the second data set and to encode the second data set to provide the second signature data.

5. The apparatus of claim 2, wherein the fuse error detection circuit includes a storage register configured to receive the first signature data from the signature register and to store the first signature data during the second fuse data broadcast.

6. The apparatus of claim 5, wherein the storage register is a shift register.

7. The apparatus of claim 2, wherein the fuse error detection circuit includes a control circuit configured to cause the signature register to latch the first data set in response to a selection signal provided during the first fuse data broadcast.

8. The apparatus of claim 7, wherein the control circuit is further configured to cause the first signature data to latch at a storage register in response to transition of a token reset signal received between the first fuse data broadcast and the second fuse data broadcast.

9. The apparatus of claim 1, wherein the fuse error detection circuit further includes a comparator circuit configured to compare the first signature data and the second signature data to provide comparison results, wherein the comparator is configured to latch the value of the match indication based on the comparison results.

10. The apparatus of claim 9, wherein the comparator circuit uses bitwise XOR logic to perform the comparison between the first signature data and the second signature data.

11. The apparatus of claim 1, wherein the fuse error detection circuit includes:
a first register configured to, during the first fuse data broadcast, receive the first data set and to encode the first data set to provide the first signature data in response to a first clock signal, wherein the first register is further configured to, during the second fuse data broadcast, receive the second data set and to encode the second data set to provide the second signature data in response to the first clock signal;
a second register configured to latch the first signature data from the first register in response to a second clock signal; and
a comparator configured to compare the first signature data and the second signature data to provide comparison results, wherein the comparator is configured to latch the value of the match indication based on the comparison results in response to a third clock signal.

12. The apparatus of claim 1, further comprising the fuse array having a set of fuses, wherein the first data set and the second data set are both read from the set of fuses.

13. The apparatus of claim 12, further comprising a fuse logic configured to read the set of fuses of the fuse array during the first and second fuse data broadcasts to provide the first data set and the second data set, respectively.

14. The apparatus of claim 1, wherein the first signature data is updated relative to the current signature data, and wherein the first signature data is indicative of a value of an entirety of the first data set or a subset of values of the first data set.

15. A method comprising:
receiving, at a fuse error detection circuit of a semiconductor device, a first data set from a fuse array during a first fuse data broadcast, wherein the first data set is based at least in part on data programmed in the fuse array;
encoding the first data set based at least in part on current signature data and the received first data set to provide first signature data;
receiving, at the fuse error detection circuit, a second data set from the fuse array during a second fuse data broadcast, wherein the second data set is based at least in part on data programmed in the fuse array;
encoding the second data set based at least in part on the first signature data and the received second data set to provide second signature data;
comparing the first signature data and the second signature data; and
providing a match indication having a value based on the comparison between the first signature data and the second signature data.

16. The method of claim 15, further comprising encoding the first data set via a signature register.

17. The method of claim 15, further comprising:
serially receiving subsets of the first data set; and
updating the first signature data based on each received subset of the first data set.

18. The method of claim 15, wherein the first signature data includes fewer bits than the first data set.

19. The method of claim 15, further comprising storing the first signature data prior to receipt of the second fuse data set.

20. The method of claim 15, further comprising, in response to the match indication indicating a mismatch between the first signature data and the second signature data, causing a third fuse data broadcast.

21. The method of claim 15, further comprising, in response to the match indication indicating a mismatch between the first signature data and the second signature data, causing the semiconductor device to suspend operation.

* * * * *

UNITED STATES PATENT AND TRADEMARK OFFICE
CERTIFICATE OF CORRECTION

PATENT NO. : 11,645,134 B2  
APPLICATION NO. : 16/545721  
DATED : May 9, 2023  
INVENTOR(S) : Miller et al.

Page 1 of 1

It is certified that error appears in the above-identified patent and that said Letters Patent is hereby corrected as shown below:

In the Claims

|  | Reads | Should Read |
|---|---|---|
| Column 18, Line 1 | "a match indication haying a value" | --a match indication having a value-- |

Signed and Sealed this  
Thirty-first Day of December, 2024

Derrick Brent  
*Acting Director of the United States Patent and Trademark Office*